United States Patent [19]

Inoue

[11] 4,430,165

[45] Feb. 7, 1984

[54] LASER-ACTIVATED ELECTRODEPOSITING METHOD AND APPARATUS

[75] Inventor: Kiyoshi Inoue, Tokyo, Japan

[73] Assignee: Inoue-Japax Research Incorporated, Yokohama, Japan

[21] Appl. No.: 401,247

[22] Filed: Jul. 23, 1982

[30] Foreign Application Priority Data

Jul. 24, 1981 [JP] Japan ................................ 56-115369
Aug. 17, 1981 [JP] Japan ................................ 56-127742
Apr. 7, 1982 [JP] Japan ................................ 57-56494

[51] Int. Cl.³ ........................ C25O 5/02; C25O 17/00
[52] U.S. Cl. .................................. 204/15; 204/224 R
[58] Field of Search ............................ 204/15, 224 R

[56] References Cited

U.S. PATENT DOCUMENTS 4,217,183 8/1980 Melcher ................................ 204/15

FOREIGN PATENT DOCUMENTS 0018500 of 0000 European Pat. Off. .
847927 of 0000 United Kingdom .
1465567 of 0000 United Kingdom .

Primary Examiner—T. M. Tufariello
Attorney, Agent, or Firm—Karl F. Ross; Herbert Dubno

[57] ABSTRACT

A method of and apparatus for electrodepositing a metal onto a workpiece wherein an electric potential is applied between an anodic electrode and the cathodic workpiece in the presence of an electrodepositing solution. A narrow thermal light beam is directed onto the workpiece and intercepted by a localized area thereon to activate an interface between the area and the electrodepositing solution. The metal in the solution is thereby electrodeposited selectively on that localized area. The beam and the workpiece are relatively displaced to successively shift the area of interception of the beam until a desired surface region on the workpiece is electrodeposited. Preferably, the thickness of the solution traversed by the beam incident upon the localized area is limited not to exceed a preselected dimension. The apparatus preferably comprises a mirror for reflecting the beam from a source thereof which is fixed in position onto the workpiece and a drive unit for displacing the mirror to achieve the required displacement of the incident beam relative to the workpiece. A lens is disposed in the optical path for the beam and the position thereof is controlled to maintain its focal plane coincident with the beam-intercepting localized area.

27 Claims, 10 Drawing Figures

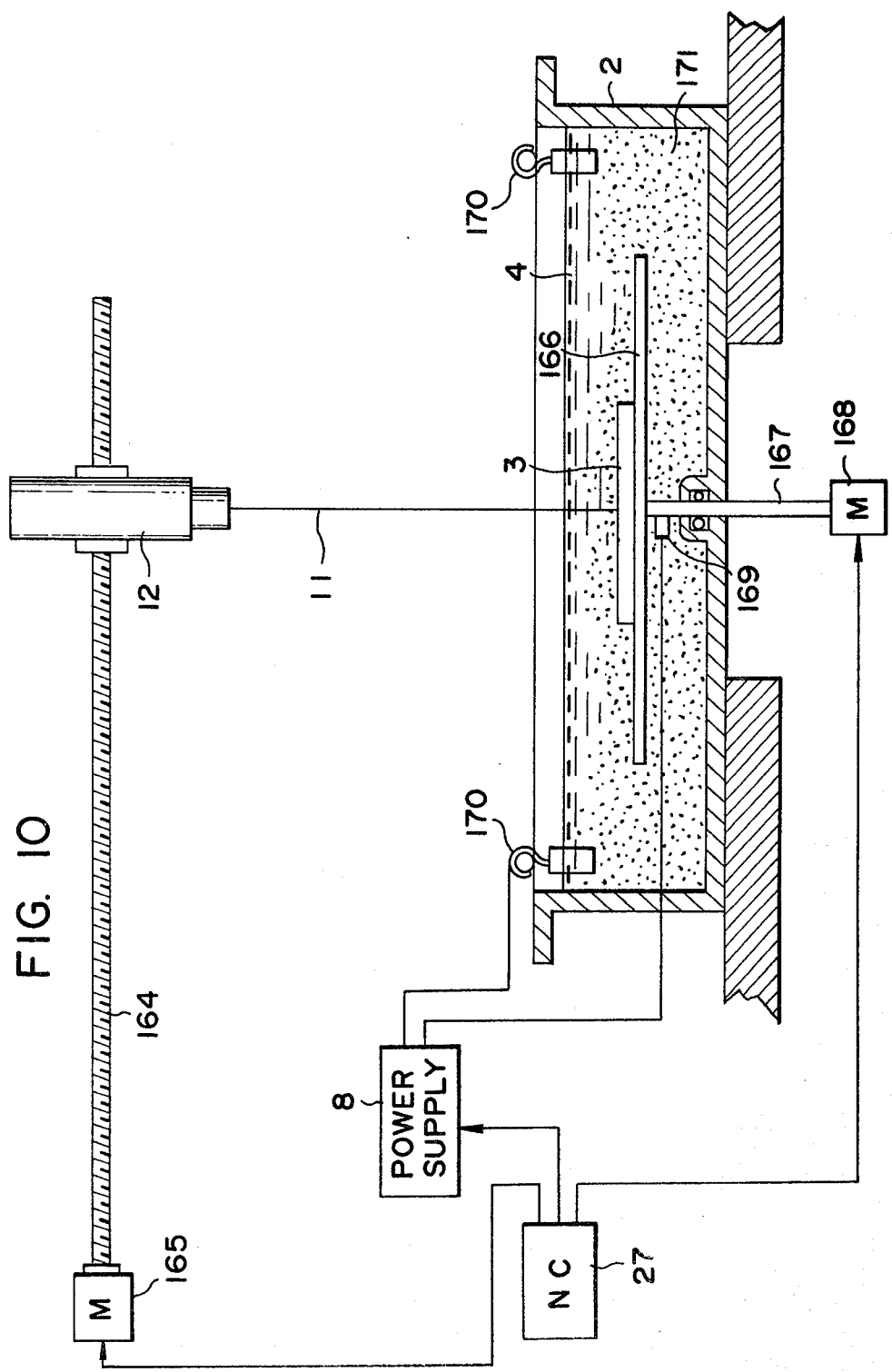

LASER-ACTIVATED ELECTRODEPOSITING METHOD AND APPARATUS

FIELD OF THE INVENTION

The present invention relates generally to electrodeposition and, more particularly, to a new and improved method of and apparatus for electrodepositing a workpiece or substrate for coating and forming purposes. Specifically, the invention relates to such a method and apparatus in which a laser or like thermal light beam is employed to enhance local electrodepositability upon the surface.

BACKGROUND OF THE INVENTION

Electrodeposition is carried out by juxtaposing an anodic electrode with a cathodic workpiece or workpiece surface in the presence of an electrodepositing solution and applying an electrodepositing potential between the anode and the workpiece or workpiece surface to allow a metal to be electrochemically deposited on the latter from the solution. The deposition may be used to permanently coat the surface or, alternatively, to produce on an electrically conductive or metalized nonconductive mold an electroformed layer of the metal which can be removed therefrom for use as a shaped metallic product such as an electrical machining tool electrode or die.

One major problem hitherto encountered in the art of electrodeposition is difficulty in achieving uniformity of deposition on a receiving surface where the surface as is quite often required is deeply recessed or intricate in shape. Generally, a deposit tends to build up selectively at relatively projecting areas and may seldom occur at a recessed corner portion, resulting in an irregularity of deposition over the surface and this tendency is accentuated as the process continues. While various techniques have been proposed to reduce the deposition irregularity, none of them have been found to be satisfactory on account of efficiency and economy. Accordingly, there has been a consistent desire in the art to produce a high-precision electrodeposited layer which is uniform in thickness, especially in die and electrode making fields.

The electrodeposition technique has also been applied to patterning a metal on a nonmetallic substrate as desired in the manufacture of electronic circuit devices. To this end, however, the prior art required complicated masking and other laborious or troublesome preparations which have been found to involve considerable additional cost and to be inefficient.

OBJECTS OF THE INVENTION

An object of the present invention seek to provide a novel and improved electrodepositing method which is highly efficient and allows a desired layer or pattern of electrodeposit to be achieved with extremely high precision and yet in a relatively simple manner.

The invention also seeks to provide a novel and improved electrodepositing apparatus which is reliable and allows a desired layer or pattern of electrodeposit to be obtained with due precision and yet automatically.

SUMMARY OF THE INVENTION

These and other objects are attained in accordance with the present invention which provides, in a first aspect thereof, a method of electrodepositing a metal onto a workpiece by bringing an electrodepositing solution containing the metal into contact with the workpiece and an electrode and passing an electric current between the electrode and the workpiece, which method comprises: directing a narrow thermal light beam onto the workpiece to intercept the beam in a localized area thereon, thereby activating an interface between the said area and the solution to allow the metal to be electrodeposited therefrom selectively onto that area; and relatively displacing the narrow thermal light beam and the workpiece to shift the localized area of interception of the incident beam successively over a desired surface region on the workpiece whereby the metal is sequentially electrodeposited on the surface region.

Specifically, the narrow thermal light beam is advantageously a beam of laser light but may be a beam of intense light in any other form. It has been found to be desirable to maintain the thickness of the solution traversed by the laser beam incident upon the localized area to be not greater then 5 cm and preferably not to exceed 1 cm. With an ordinary electrodepositing solution, such thickness limitation is generally satisfactory with an argon gas laser but is desirably limited further not to exceed 5 mm or 1 mm with a carbondioxide laser.

The narrow thermal light beam is emitted from a source thereof which may be fixed in position, the beam in its optical path being reflected by a mirror so as to be incident upon the localized area. The displacement of the mirror is advantageously used to effect at least a portion of the required relative displacement between the beam and the workpiece.

According to a further feature of the invention, the beam in its optical path is passed through a lens and the method further includes positioning the lens to have its focal plane for the beam coincident with the localized area.

The invention also provides, in a second aspect thereof, an apparatus for electrodepositing a metal onto a workpiece, which apparatus comprises: means (a) for bringing an electrodepositing solution containing the metal into contact with the workpiece and an electrode; (b) power supply means for passing an electric current between the electrode and the workpiece; (c) means for directing a narrow thermal light beam onto the workpiece to cause the beam to be intercepted in a localized area thereon, thereby activating the interface between the said area and the solution to allow the metal to be electrodeposited therefrom selectively onto the area; and (d) means for relatively displacing the narrow thermal light beam and the workpiece to shift the localized area of interception of the beam successively over a desired surface region on the workpiece whereby the metal is sequentially electrodeposited on the surface region.

Specifically, the means (c) may advantageously include a laser constituting a source of the narrow thermal light beam.

The means (c) may also advantageously include a source of the narrow thermal light beam together with mirror means for reflecting the beam from the source onto the workpiece. The means (d) then includes means (d') for displacing the mirror means. The source may be fixed in position. The means (c) may also advantageously include lens means disposed in the optical path between the source and the workpiece for establishing a focal plane for the beam from the source. The apparatus then further comprises means (e) for displacing the lens means so as to maintain the focal plane coincident with the localized area as the beam and the workpiece are relatively displaced by means (d).

In accordance with a futher feature of the invention, means (c) comprises a unitary assembly including a source of the beam and solid optical guide means having its one end connected to the source and its other end for projecting the beam transmitted via the optical guide means from the source. The apparatus then comprises means (f) for maintaining the said other end of the optical guide means closely spaced from the localized area as the beam and the workpiece are relatively displaced by means (d).

In accordance with a still further feature of the invention, the electrode comprises a hollow, electrically conductive member having its one open end connected to a source of the beam and its other open end adapted to be closely spaced from the localized area for projecting the beam transmitted from the source onto the area. The said other open end of the hollow member is fitted with a transparent or semitransparent solid member for preventing introduction thereinto of the electrodepositing solution in the region of the workpiece. The solid member is preferably shaped so as to serve as a lens for the beam to be passed therethrough onto the said area from the source. Alternatively, means may be used for filling the hollow sapce in the electrode member with a pressurized gas to prevent introduction thereinto of the electrodepositing solution in the region of the workpiece.

BRIEF DESCRIPTION OF THE DRAWING

These and other features of the present invention as well as advantages thereof will become more readily apparent from a reading of the following description of certain embodiments thereof when taken with reference to the accompanying drawing in which:

FIG. 10 is a similar view illustrating an apparatus constructed in a different form to embody the present invention.

SPECIFIC DESCRIPTION

Figure 1:
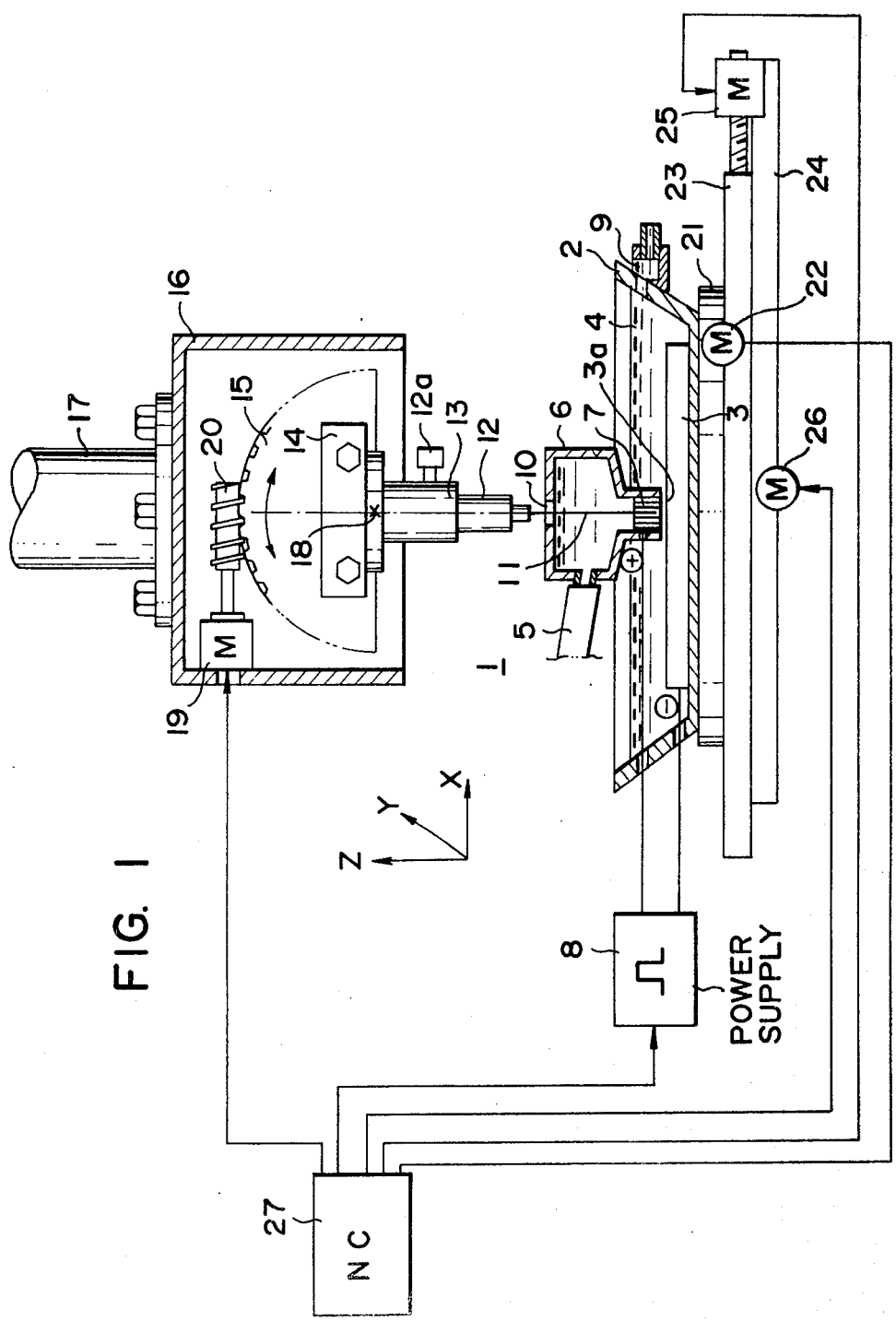
FIG. 1 is a diagrammatic view, partly in section, illustrating an apparatus according to the present invention.

Referring now to FIG. 1 there is shown an electrodepositing apparatus 1 embodying the present invention. The apparatus 1 includes a worktank 2 which accommodates a workpiece 3 which is shown immersed in an electrodepositing solution or liquid electrolyte 4 therein. The electrodepositing solution 4 is supplied from a source thereof (not shown) through an inlet pipe 5 into a delivery chamber 6 for temporary storage therein and thence onto a surface of the workpiece 3 through a porous or mesh-screen electrode 7 attached to the open end of the delivery chamber 6. The electrode 7, which is poled anodic, is electrically connected to the positive output terminal of an electrodepositing power supply 8 whose negative output terminal is electrically connected to the workpiece 3 secured in position within the worktank 2. The power supply 8 may be of a conventional type for passing and electrodepositing current between the anode 7 and the cathodic workpiece 3 to electrodeposit a metal from the electrolyte 4 onto the workpiece 3. As indicated, the power supply 8 is preferably of pulsed type so that the electrodepositing current is in the form of a succession of time-spaced, discrete electrical pulses whose on-time or duration and off-time or interval as well as current magnitude are adjustable, preferably independently of one another. The worktank 2 is provided at an upper end portion thereof with a drain outlet 9 to accept the overflowing electrolyte and to feed it to a suitable treatment vessel (not shown).

The electrolyte delivery chamber 6 is formed with an opening or passage 10 through which a laser beam 11 from a laser beam source or gun 12 is passed to irradiate a localized area on the surface of the workpiece 3. The laser gun 12 is carried by a holder 13 which is in turn secured to a support member 14 attached to a semi-circular disk 15. The latter is a semi-circular worm wheel rotatably mounted on a head 16 which depends from a spindle 17. The worm wheel 15 is rotatable about an axis 18 i.e. a, Y-axis, to swing the laser gun 12 and hence the laser beam 11 in an X-Z plane orthogonal to the Y-axis 18. The angle of swing is established by the operation of a motor 19 which is drivingly coupled with a worm gear 20 in mesh with the worm wheel 15. It should be noted that the gun holder 13 or the support member 14 therefor and the electrolyte delivery chamber 6 are mechanically coupled with each other.

The worktank 2 is securely mounted on a rotary table 21 which is driven by a motor 22 to angularly displace the workpiece 3 in a predetermined polar coordinate system in the X-Y plane. The rotary table 21 is in turn carried on X-axis and Y-axis tables 23 and 24 in a cross-slide arrangement to rectilinearly displace the workpiece 3 in the X-Y plane coordinate system. The tables 23 and 24 are driven by motors 25 and 26, respectively. A control unit 27 is provided to furnish the motors 19, 22, 25 and 26 with respective drive signals based upon preprogrammed data to displace the workpiece 3 so that the laser beam 11 sweeps in a scanning manner with the four degrees of freedom along a predetermined path on the surface thereof. The control unit 27 is also stored with velocity commands for the displacement and further with commands for controlling the output parameters of the electrodeposition power supply 8 in accordance with a predetermined program. Furthermore, the beam gun 12 has a parameter setting circuit sequence-controlled by the control unit 27 to sequentially alter the diameter and the energy of the irradiating laser beam 11 in accordance with a predetermined program.

In operation, the delivery chamber 6 is furnished with an electrodepositing electrolyte, e.g. a nickel or copper electroplating solution, to slowly deliver it onto the surface of the workpiece 3 while the power supply 8 is actuated to apply an electrodepositing current, preferably in the form of a succession of pulses, between the electrode 7 and the workpiece 3. Electrodepositing conditions, including the temperature of the solution and the voltage level, are set up such that without irradiation with a laser beam, electrodeposition takes place uniformly over the workpiece surface 3a and slowly as usual or at a rate much slower than a customarily attainable optimum or highest deposition rate, or even so that practically no electrodeposition can occur without irradiation with a laser beam.

It has been found that the laser beam 11 acts as a narrow thermal beam to heat the depositing solution to 45° to 60° C. in the region of a localized area on the workpiece surface 3a that it impinges and thereby selectively activates that interface to enhance electrodepositability thereon. The focusing knob 12a for the laser beam 11 provided on the gun holder 13 may be used to control the size of the localized activation or depositability-enhanced area on the workpiece surface 3a. By relatively displacing the laser beam 11 and the workpiece 3, it follows that electrodeposition develops on the workpiece surface 3a selectively along the path of displacement of the laser beam 11 relative to the workpiece 3. Thus, a pattern of electrodeposition defined by the size of the beam 11 and the path of the relative displacement is created on the workpiece surface 3a. The rate of the relative displacement is determined according to the thickness of an electrodeposition pattern desired. Not only is it possible in this manner to achieve a continuous electrodeposition pattern of any shape desired but a set of discontinuous or discrete such patterns is obtainable. To the latter end, the control unit 27 operates to turn off the power supply 8 during programmed time intervals in the course of the scanning operation with the laser beam 11 selectively to leave intact those areas which are within the path of the relative displacement but not to be electrodeposited. Alternatively, or in addition, the laser gun 12 may be deactuated selectively during those time intervals or for the corresponding sections of the relative displacement. It is, of course, desirable that minimum time intervals be employed to traverse these sections.

It will be apparent that the method of the invention is useful for producing a printed circuit or conductor pattern on a board for electronic devices. The method is also advantageously used for metal plating or forming on a substrate which is of an intricate contour or has one or more recesses or grooves which could be electroplated or electroformed only with difficulty by the conventional electrodepositing technique. Accordingly to the invention, electrodeposition or electroforming is achieved uniformly over such a substrate by controlling the time of irradiation or the rate of scan with the laser beam 11 or the local point thereof according to the position on the workpiece surface or substrate 3a. Generally, a recessed area or corner portion in a recess may be irradiated for a longer time than other areas.

Figure 2:
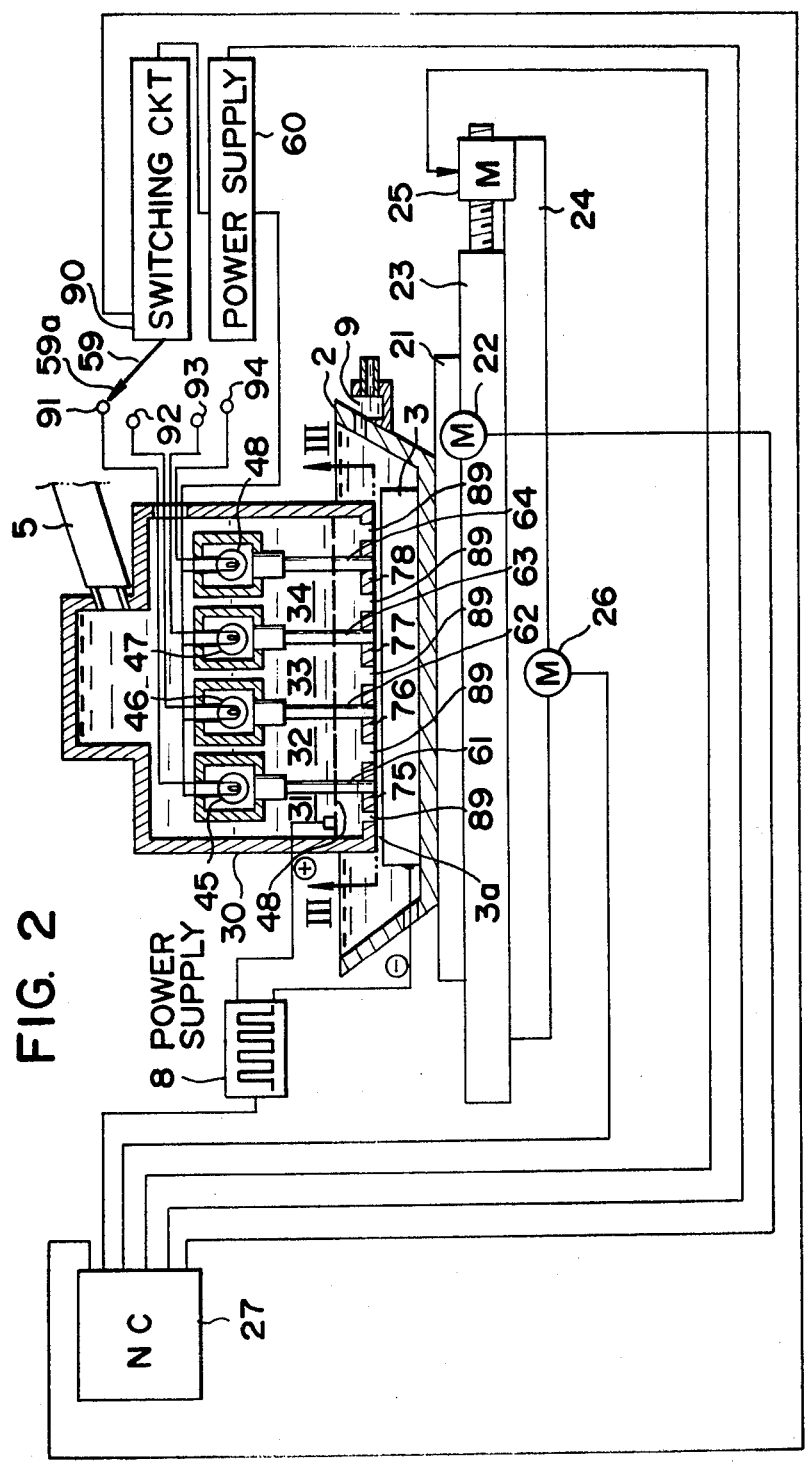
FIG. 2 is a similar view illustrating an arrangement of the invention in which a plurality of beam irradiation units are accommodated in an electrolyte delivery chamber.
Figure 3:
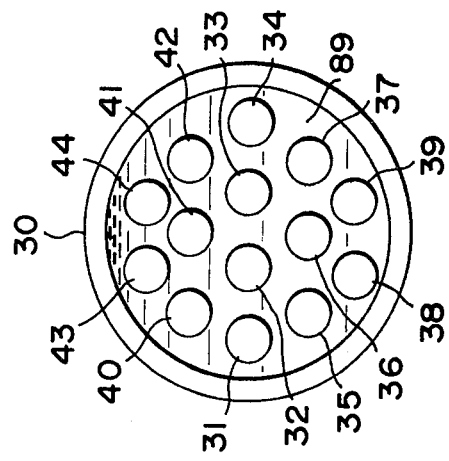
FIG. 3 is a generally cross-sectional view of such a plural unit assembly chamber.

Referring to FIG. 2 in which the same reference numerals as those in FIG. 1 are used to designate the same or functionally same parts, a modified apparatus embodying the present invention is illustrated. The apparatus 29 makes use of a relatively large electrolyte delivery chamber 30 in which a plurality of laser irradiation units 31–44 (FIG. 3) are accommodated. Each of these units, of which only 31–34 appear in FIG. 2, comprises a laser source 45, 46, 47, 48, . . . connected via a rotary switch 59 to an energization power supply 60 and an optical guide 61, 62, 63, 64, . . . connected at its upper end to the laser source and having its lower end juxtaposed with the workpiece surface 3a and fitted with a disk 75, 76, 77, 78, . . . These disks are positioned to be flush with one another, defining the lower end surface of the delivery chamber 30 and are spaced apart from one another with a spacing 89 serving as an electrolyte delivery passage.

The rotary switch 59 comprises a rotary arm 59a actuated by a switching circuit 90 arranged for engagement with fixed contacts 91, 92, 93, 94, . . . , which are connected to the laser sources 45, 46, 47, 48, . . . , respectively. The switching circuit 90 is operated by the control unit 27 in accordance with a predetermined program stored therein to selectively energize the laser sources 45, 46, 47, 48, . . . from the power supply 60. The control unit 27 also acts on the power supply 60 to control the intensity of the laser beam emitted from each of the sources 45, 46, 47, 48, . . . in accordance with a predetermined stored program. In each of the units 31, 32, 33, 34, . . . , the laser beam emitted from the source 45, 46, 47, 48, . . . passes through the optical guide 61, 62, 63, 64, . . . to irradiate a localized area on the workpiece surface 3a in the presence of a low-velocity stream of the electrodepositing solution supplied from the inlet conduit 5 through the delivery chamber 30 and the outlet passage 89 thereof. The localized area is thereby activated and selectively electrodeposited when the deposition potential is applied from the power supply 8 between the workpiece 3 and a mesh-screen electrode 105 disposed in the delivery chamber 30.

Figure 5:
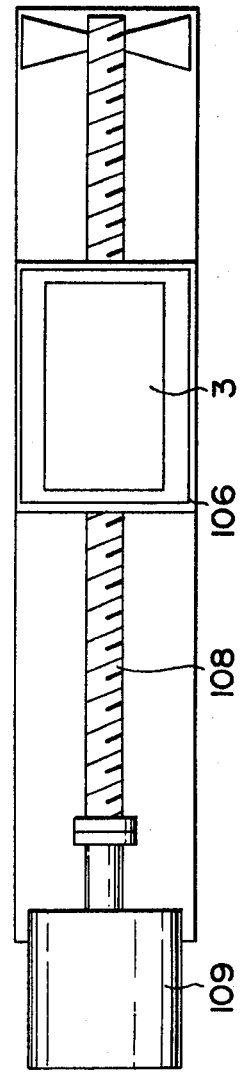
FIG. 5 is a generally top plan view of a portion of the apparatus shown in FIG. 4.
Figure 4:
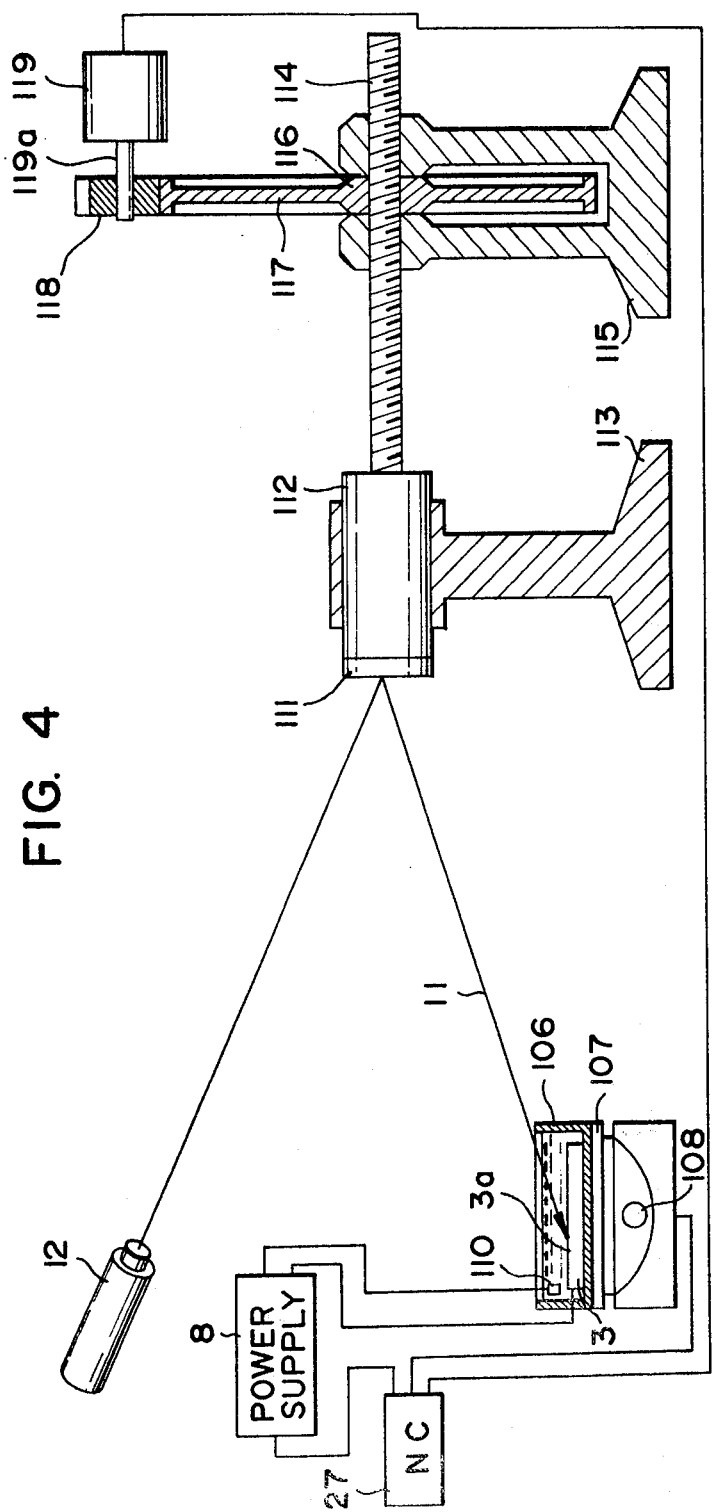
FIG. 4 is a diagrammatic view, partly in section and partly in perspective, illustrating another apparatus for practicing the method of the invention.

In the further embodiment shown in FIGS. 4 and 5 the laser beam 11 emitted from a laser gun 12 is, upon reflection by a mirror 111, trained on a workpiece 3 immersed in an electrodepositing solution in a worktank 106. The latter is securely mounted on a slide table 107 with which is drivingly coupled a feed screw 108 extending in the direction normal to the sheet of the drawing to position the workpiece 3 in that direction along a predetermined coordinate axis, i.e. a Y-axis. The feed screw 108 is driven by a motor 109 (FIG. 5) which operates in response to drive signals furnished from a control unit 27, e.g. a numerical controller. The workpiece 3 is electrically connected to the negative terminal of an electrodepositing power supply 8 whose positive terminal is electrically connected to an anode 110 disposed within the electrolyte in the worktank 106. Here again, the power supply 8, operates in response to commands from the control unit 27.

The mirror 111, having a vertical mirror face, is carried on a horizontal support member 112 which is supported on a pedestal 113 so as to be movable horizontally along a predetermined coordinate axis, i.e. an X-axis. The support member 112 is carried by a lead screw 114 which is slidably supported on a pedestal 115. The leakscrew 114 is in mesh with a nut 116 fitted in the center of a large gear 117 in mesh with a small gear 118. The latter is carried on the drive shaft 119a of a motor 119 which operates in response to drive signals furnished from the control unit 27. As the motor 119 is driven, the leakscrew 114 is rotated to displace the support member 112 and hence the mirror 111 in the direction of the X-axis to displace the position of the laser beam 11 reflected thereby and impinging on the workpiece surface 3a.

The control unit 27 has path data for relative displacement of the reflected laser beam 11 and the workpiece 3 preprogrammed therein and operates to produce from those data drive signals for the operation of the X-axis motor 119 and the Y-axis motor 109.

The electrolyte may, of course, be any conventional electrodepositing solution. For example, copper sulfate solution may be used for copper deposition. For nickel deposition, sulfonic nickel solution may be used. The laser should preferably be an argon gas laser (having a wavelength between 4880 and 5145 augstroms, green), which has a high transmissivity to such a solution. The laser beam can penetrate the solution as thick as 1 to 5 cm and, without substantial heating thereof, is capable of selectively activating a localized area on the workpiece surface to enhance its electrodepositability. By contrast, a carbon-dioxide gas laser (having a wavelength of 10.6 $\mu$m) is relatively low in transmissivity through the solution mentioned and requires that the solution should be present in a thickness as small as 5 mm or less. For example, a carbon-dioxide gas laser beam of 50 watt output can successfully be used to scan a workpiece at a rate of 50 mm/min in electrodeposition of nickel upon the workpiece from a sulfonic nickel electrodepositing solution when the thickness of the solution on the workpiece is 0.5 mm. The solution of that thickness through which the beam travels is then heated up to 60° C. When the thickness is increased to 5 mm, the degree of localization of the electrodeposition is largely reduced.

Since the size of a laser beam spot can be reduced to twice the wavelength of the beam, the method of the invention is advantageously applicable to the printing-type deposition wiring of tiny electronic devices and also to a high-precision localized electrodeposition. In electrodeposition of nickel from a sulfonic nickel solution, an argon gas laser can be used to provide a beam spot of 0.2 mm diameter and thereby a localized electrodeposition of the same area. This area is increased to 4 mm when the laser is replaced by a carbon-dioxide gas laser.

Figure 6:
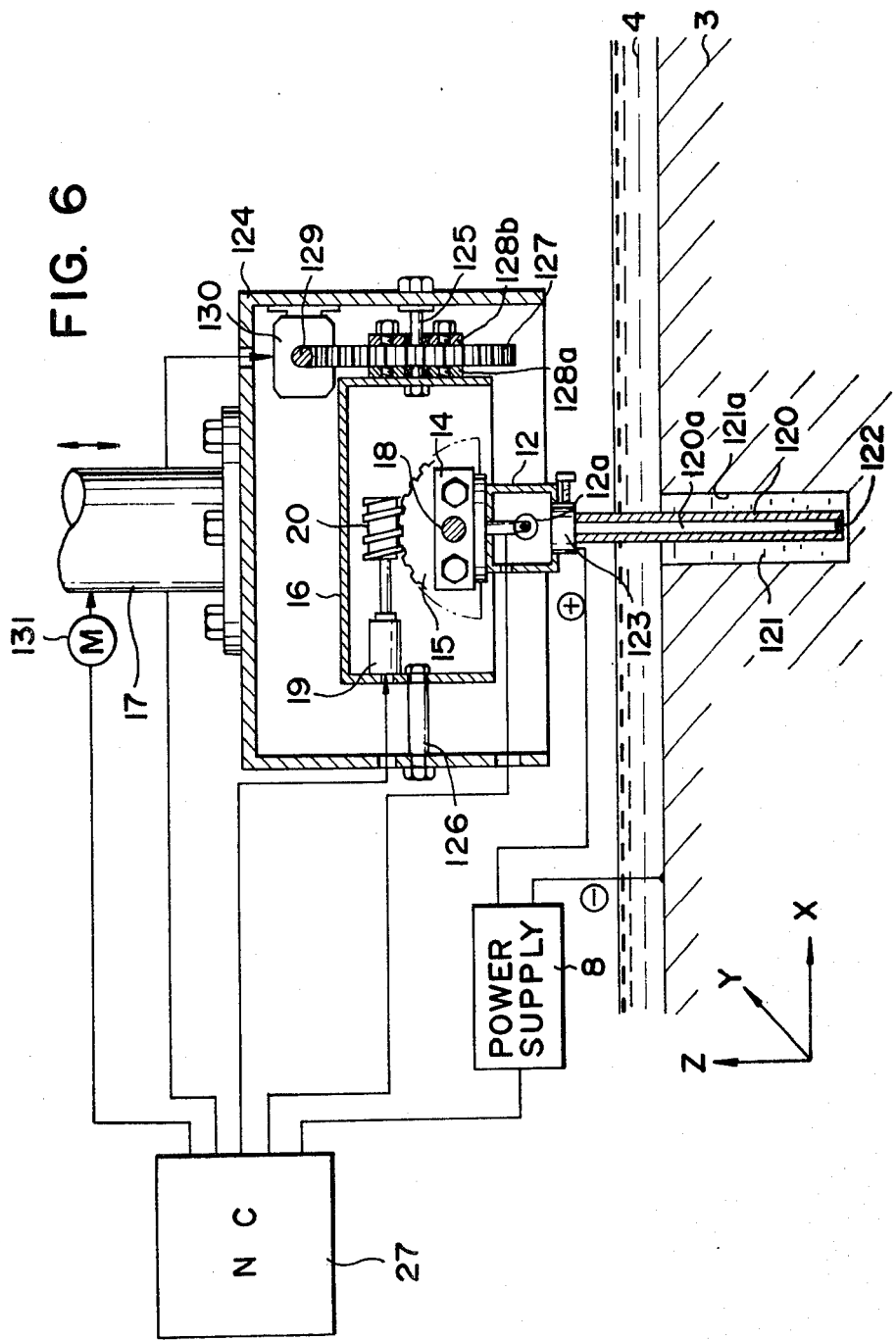
FIG. 6 is a diagrammatic view, partly in section and partly in block-diagram form, illustrating a further embodiment of the invention.

In the embodiment of FIG. 6, the anode is constituted by a tubular electrically conductive member 120 especially but not exclusively designed to be inserted into a recess 121 in a workpiece 3 the inner wall 121a of which recess is to be uniformly electrodeposited. It is shown that the tubular electrode 120 has at its lower or forward end a transparent or semitransparent member 122 fitted therein which is preferably shaped to serve as a convex lens for a laser beam emitted from a laser 12. The tubular member 120 is secured to the laser gun 12 so that the laser beam emitted from the laser source 12a is passed through the inner bore 120a of the tubular electrode 120 and the transparent or semi-transparent member 122 for irradiation of a localized area on the surface of the workpiece 3 within the recess 121. The member 122 is designed also to prevent an electrodepositing solution or electrolyte 4 in the recess 121 from entering the inner bore 120a of the tubular electrode 120.

The tubular electrode 120 has towards its end secured to the laser gun 12 a ring conductor 123 fitted thereon which is electrically connected to the positive terminal of the power supply 8 for conducting an electrodeposition current to the anodic electrode 120. The negative terminal of the power supply 8 is electrically connected to the workpiece 3. Here again, the power supply 8 is controllable in response to preprogrammed command signals from the control unit 27, e.g. a numerical controller.

The laser gun 12 is secured to a support member 14 which is in turn secured to a worm wheel 15 supported by the casing 16 so as to be rotatable about the shaft 18. The worm wheel 15 is in mesh with a worm gear 20 which is drivably connected to the output shaft of a motor 19 secured to the casing 16. Furthermore, it is seen that the casing, 16 is supported by and within a larger casing 124 so as to be rotatable about coaxial rotary shafts 125 and 126. A worm wheel 127 carried on the rotary shaft 125 is secured to the smaller casing 16 by means of washers 128a and 128b and is in mesh with a worm gear 129 drivingly connected to the output shaft of a motor 130 secured to the larger casing 124. The latter is carried by a spindle 7 which is vertically displaceable by means of a motor 131. It will thus be apparent that as the motors 19 and 130 are driven, the laser gun 12 and the tubular electrode 120 are swung in the X-Z plane and the Y-Z plane, respectively. As the motor 131 is driven, the vertical position of the tubular electrode 120 is altered.

The motors 19, 130 and 131 operate in response to respective drive signals furnished from the control unit 27 based upon path data preprogrammed therein for relative displacement of the forward or lower end of the tubular electrode 120 and the workpiece 3 and for the angular positions of the tubular electrode 120. The control unit 27 is also used to furnish the laser source 12a with command signals to control the output power of the laser gun 12, the size of the laser beam and/or the time of laser irradiation.

Figure 7:
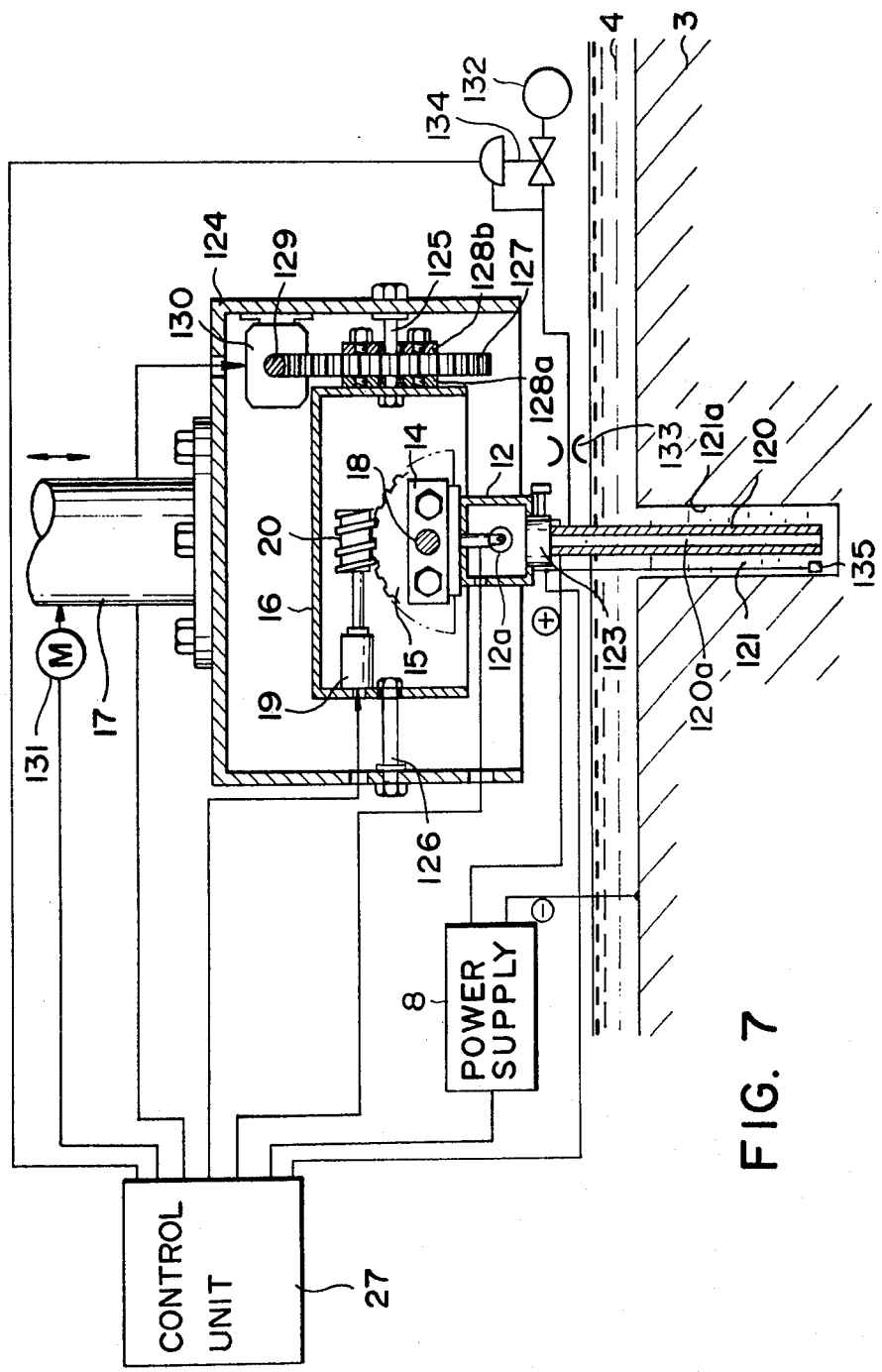
FIG. 7 is a similar view illustrating a modification of the arrangement of FIG. 6.

FIG. 7 shows a modification of the embodiment of FIG. 6 and uses the same reference numerals used therein to indicate the same parts. In the arrangement of FIG. 7, the inner bore 120a of the tubular electrode 120 communicate with a source of pressure gas 132, such as a compressor, via a throttle valve 133 and a pressure-regulating valve 134. In this manner, the inner bore 120a is filled with the pressurized gas to prevent entry of the electrodepositing solution 4 therein. The pressure-regulating valve 134 operates in response to command signals furnished from the control circuit 27. Furthermore, a sensor 135 is shown disposed adjacent to the forward end of the tubular electrode 120 such as to sense the depth thereof below the surface of the electro-depositing solution 4. The sensor 135 depends from the laser gun 12 and operates to furnish a sensing signal to the control unit 27. The control circuit 27 operates to control the pressure-regulating valve 134 so that the pressure of the compressed gas within the inner bore 120a of the tubular electrode 120 always exceeds the pressure of the solution 4 in the open end region of the tubular electrode 120 to prevent entry of the solution into the bore 120a thereof.

Figure 8:
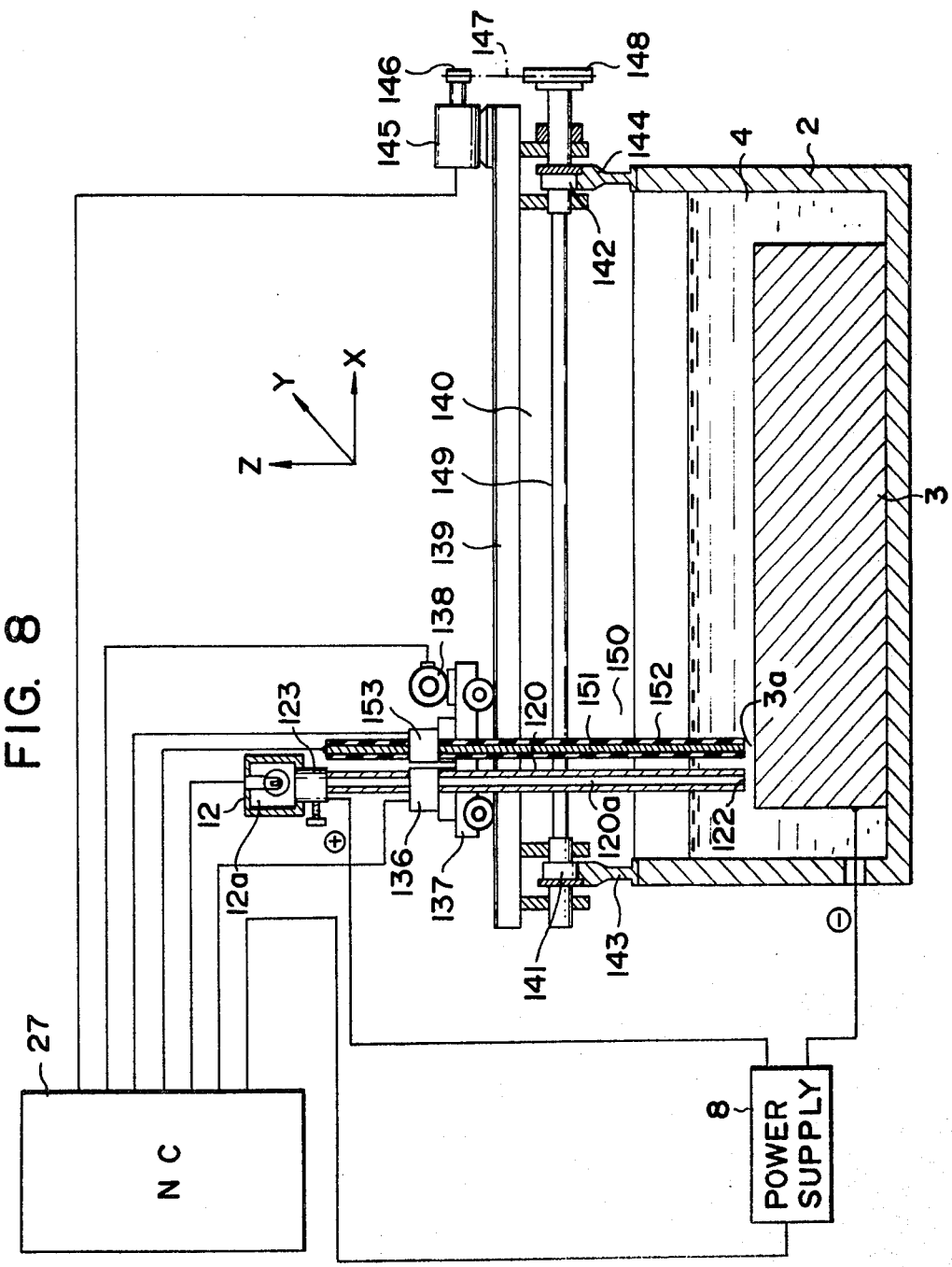
FIG. 8 is a similar view illustrating a further apparatus for carrying out the method of the invention.

In the further modified arrangement of FIG. 8, a unit structure of the laser gun 12, the annular conductor 123 and the tubular electrode 120 in combination as shown in FIGS. 6 and 7 are carried by a vertical positioner 136 seated on a wheeled carriage 137. The vertical positioner 136 operates in response to drive signals furnished from the control unit 27 to position the forward end of the tubular electrode 120 in closely spaced juxtaposition with the surface of the workpiece 3 which is shown to be planar but may, as is commonly the case be of an intricate three-dimensional contour. In this arrangement, it is shown that the forward end of the tubular electrode 120 is fitted with a transparent or semi-transparent member 122 as shown in FIG. 6 to prevent the electrodepositing solution a in the worktank 2 from entering the internal bore 120a. It will be understood that the provision of this member may be replaced by a gas-pumping system as shown in FIG. 7.

The wheeled carriage 137 is displaceable by a motor 138 so as to roll over a track 139 in the direction of the X-axis indicated. The track 139 is securely supported on a wheeled carriage 140 with wheels indicated at 141 and 142 and adapted to roll on a pair of rails 143 and 144 to displace the carriage 140 in the direction of the Y-axis indicated. The rails 143 and 144 are mounted to stand vertically on the upper edges of two opposed walls of the worktank 2, respectively and to extend in parallel with each other. A motor 145 mounted on the track 139 has at its output shaft a pulley 146 which is coupled via a belt 147 with a pulley 148 secured to the rotary shaft 149 carrying the wheels 141 and 142 for the carriage 140. As the motor 145 is driven in response to drive signals furnished from the control unit 27, the carriage 140 is thus driven to position the axis of the tubular electrode in the Y-axis coordinate.

The arrangement of FIG. 8 further includes a provision for measuring the thickness of an electrodeposited layer on the workpiece surface 3a behind the active forward end of the tubular electrode 120. Thus, there is provided a measuring electrode assembly 150 comprising an electrode 151 coated with an insulating film 152, which assembly extends in parallel with the tubular electrode 120 and is carried by its vertical positioner 153 seated on the wheeled carriage 137. The vertical positioner 153 operates in response to drive signals furnished from the control unit 27 to position the forward end of the measuring electrode 151 in contact or closely spaced juxtaposition with the electrodeposited workpiece surface 3a. Since the single carriage 137 is used to carry both the tubular electrode 120 and the measuring electrode assembly 150, the axis of the latter is held adjacent to the axis of the tubular electrode 120.

The measuring electrode 151 is adapted to sense its contact or proximate relationship with the electrodeposited workpiece surface 3a by measuring, for example, the electrical resistance therebetween, and to transmit a sensed signal to the control unit 27. The latter continues to furnish drive signals to cause the vertical positioner 153 to advance the measuring electrode assembly 150 until its preselected contact or proximity relationship with the electrodeposited workpiece surface 3a is attained. The distance of advance required may be registered in the control unit 27 to produce control signals which act on the laser gun 12 to control the intensity of the light emitted from the laser source 12a.

Figure 9:
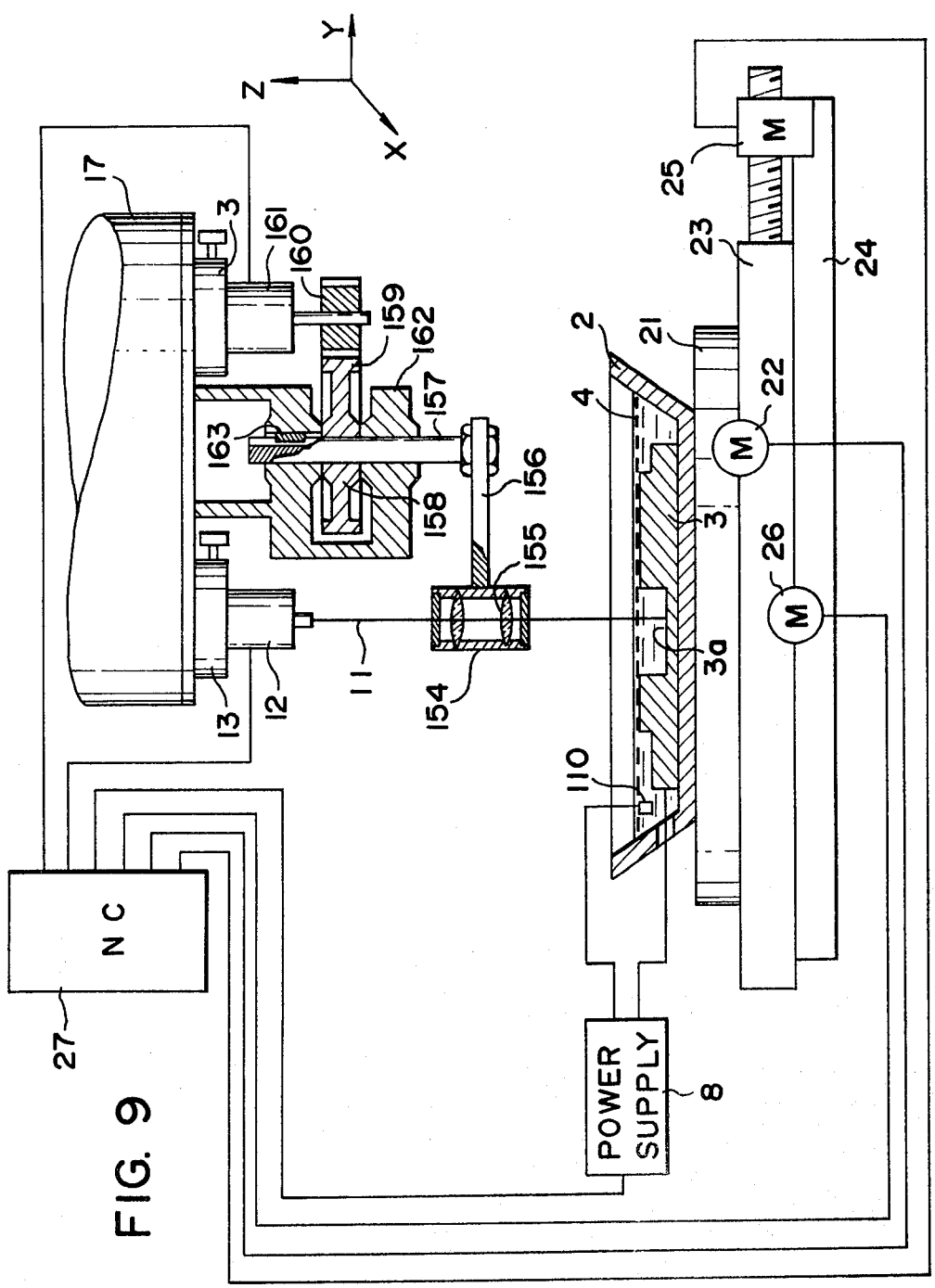
FIG. 9 is a similar view illustrating another arrangement for carrying out the method of the invention.

FIG. 9 shows a laser-assisted electrodepositing apparatus embodying the present invention and again makes use of same reference numerals as used in the previous FIGURES to designate the same or functionally same parts. In this arrangement, a laser gun 12 securely mounted via its holder 13 are a spindle or ram head 17 is designed to project a vertical laser beam 11 for irradiation of a localized area on the workpiece surface 3a therewith. In the path of the laser beam 11 there is provided a beam-focusing assembly 154 in which a plurality of lenses 155 are arranged. The assembly 154 is supported by a horizontal arm 156 which is in turn supported by a vertical leadscrew 157 at its lower end. The lead screw 157 is in mesh with a nut 158 which is toothed on its gear periphery 159 in mesh with a gear 160 secured to the output shaft of a motor 161. By its holder the motor 161 is secured to the spindle 17. The nut 158 is, for its vertical position to be fixed, retained between a pair of bearing surfaces of a support member 162 secured to the spindle 17. Further, the leadscrew 157 formed with a key-in groove engaged by a projection 163 on the support member 162 is held against rotation. The motor 161 operates in response to drive signals furnished from the control unit 27, e.g. a numerical controller, to position the lens assembly 154 so that the laser beam 11 projected from the laser gun 12 is focused on the localized area on the workpiece surface 3a.

The arrangement of FIG. 9 is particularly advantageous for electrodepositoin of a workpiece with recessed surfaces or of an intricate contour as shown. The control unit 27 provides the motors 22, 25 and 26 with drive signals to displace the workpiece 3 along a preprogrammed path in the X-Y plane so that its surface 3a is swept over by the laser beam 11 from the laser gun 12. During the planar displacement of the workpiece 3 in the X-Y plane, the motor 161 is responsive to Z-axis positioning signals from the control unit 27 to regulate the position of the lens assembly 154 so as to focus the laser beam 11 on the surface of the workpiece 3 at its instantaneous scanned localized area.

In another apparatus for practicing the invention shown in FIG. 10, a vertically oriented laser gun 12 is carried on a horizontally extending leadscrew 164 so as to be shiftable therealong in a horizontal direction. The leadscrew 164 is driven by a motor 165 which operates in response to drive signals furnished from the control unit 27 to displace the laser beam 11. A workpiece 3 for irradiation by the laser beam 11 is mounted on a turntable 166 which is rotatable about a shaft 167 and positioned in a worktank 2. The shaft 167 is rotated by a motor 168 which operates in response to drive signals from the control unit 27 to turn the table 166 and, in conjunction with the operation of the motor 165, to progressively displace the localized area on the workpiece 3 irradiated by the laser beam 11. The workpiece 3 is electrically connected via the conductive table 166, the conductive shaft 167 and a brush conductor 169 to the negative terminal of the power supply 8 whose positive terminal is electrically connected to a plurality of anodes 170 which partially dip into the electrodepositing solution 4 retained in the worktank 2.

The depositing solution 4 may, as mentioned previously, be any conventional electrodepositing solution such as copper sulfate or sulfonic nickel or chromium solution and may incorporate a particulate solid substance 171 in suspension. Such substances include alumina, ferrite, tungsten carbide, silicon carbide, boron carbide, boron nitride and diamond. By using such a depositing solution, it is possible to obtain an electrodeposited layer of a metal having solid particles of one or more substances distributed therein on the surface of the workpiece 3.

What is claimed is:
1. A method of electrodepositing a metal in a continuous layer of a uniform thickness onto a workpiece of an intricate surface contour, comprising the steps of:
(a) passing an electric current between an electrode and the workpiece in the presence of a metal electrodepositing solution flowing therebetween;
(b) directing a narrow thermal energy beam towards the surface of the workpiece to cause the beam to be incident upon a localized area thereon, thereby activating an interface between said area and said flowing solution to allow said metal to be electrodeposited therefrom selectively onto said area;

(c) relatively displacing said incident beam and said workpiece generally translationally in a scanning manner such as to shift said localized beam incidence continuously over a desired surface region on the workpiece surface whereby said metal is progressively electrodeposited in the continuous layer on said surface region; and (d) increasing the uniformity of the thickness of said layer of electrodeposition by controlling at least one of the parameters: the rate of said displacement between the incident beam and the workpiece, the diameter and energy of the incident beam, the electrical parameters of said electric current and the rate of flow of said solution flowing between the electrode and the workpiece, as a function of the instantaneous position of the workpiece displaced relative to said incident beam in step (c).

2. A method of electrodepositing a metal in a continuous layer of a uniform thickness onto a workpiece of an intricate surface contour, comprising the steps of:

passing an electric current between an electrode and the workpiece in the presence of a metal electrodepositing solution flowing therebetween;

directing a narrow thermal energy beam towards the surface of the workpiece from a beam generator through a lens disposed in a path of the beam to cause the beam to be incident on a localized area of the workpiece, thereby activating an interface between said area and said flowing solution to allow said metal to be electrodeposited therefrom selectively onto said area;

relatively displacing said beam generator and said workpiece translationally in a scanning manner such as to shift said localized beam incidence continuously over a desired surface region on the workpiece surface whereby said metal is progressively electrodeposited in the continuous layer on said surface region; and increasing the uniformity of the thickness of said layer of electrodeposition by controlling the position of said lens in said path so as to maintain said incident beam to be always focused on the instantaneous localized area in said surface region against a changing thickness of said solution traversed by said incident beam.

3. The method defined in claim 1 or claim 2 wherein said beam is a laser beam.

4. The method defined in claim 3, further comprising the step of maintaining the thickness of said solution traversed by said laser beam incident upon said localized area to be not greater than 5 cm.

5. The method defined in claim 4 wherein said thickness is limited not to exceed 1 cm.

6. The method defined in claim 4 wherein said laser is argon gas laser.

7. The method defined in claim 4 wherein said thickness is limited not to exceed 5 mm.

8. The method defined in claim 5 wherein said laser is carbon-dioxide laser.

9. The method defined in claim 8 wherein said thickness is limited not to exceed 1 mm.

10. A method of electrodepositing a metal onto a workpiece by bringing a metal electrodepositing solution in contact with the workpiece and an electrode and passing an electric current between the electrode and the workpiece, the method comprising the steps of:

directing a laser beam which is emitted from a source thereof fixed in position and is reflected by a mirror towards the workpiece to cause the reflected beam to be incident upon a localized area thereon, thereby activating an interface between said area and said solution to allow said metal to be electrodeposited therefrom selectively onto said area; and displacing said incident beam relative to said workpiece translationally at least in part by displacing said mirror translationally to shift said localized beam incidence successively in a scanning manner over a desired surface region on said workpiece whereby said metal is sequentially electrodeposited on said surface region.

11. An apparatus for electrodepositing a metal in a continuous layer of a uniform thickness onto a workpiece of an intricate surface contour, comprising (a) means for supplying a metal electrodepositing solution in a flow between said workpiece and an electrode;

(b) power supply means for passing an electric current between said electrode and said workpiece through said flowing solution;

(c) means for directing a narrow thermal energy beam onto the surface of said workpiece to cause said beam to be incident upon a localized area thereon, thereby activating the interface between said area and said flowing solution to allow said metal to be electrodeposited therefrom selectively onto said area;

(d) means for relatively displacing said incident beam and said workpiece generally translationally in a scanning manner such as to shift said localized beam incidence continuously over a desired surface region on said workpiece surface whereby said metal is electrodeposited in the continuous layer on said surface region; and (e) deposition control means for controlling at least one of the parameters; the rate of said displacement between the incident beam and the workpiece, the diameter and energy of the incident beam, the electrical parameters of said electric current and the rate of flow of said solution flowing between the electrode and the workpiece, as a function of the instantaneous position of the workpiece displaced relative to said incident beam by the means (d).

12. An apparatus for electrodepositing a metal onto a workpiece, comprising:

(a) means for bringing a metal electrodepositing solution into contact with said workpiece and an electrode;

(b) power supply means for passing an electric current between said electrode and said workpiece in the presence of said solution therebetween;

(c) means for directing a narrow thermal light beam onto said workpiece to cause said beam to be incident upon a localized area thereon, thereby activating the interface between said area and said solution to allow said metal to be electrodeposited therefrom selectively onto said area, said means (c) comprising a unitary assembly including a source of said beam and an elongate solid optical guide member having its one end connected to said source and its other end disposed in said solution for projecting said beam transmitted via said elongate optical guide member from said source onto said localized area;

(d) means for relatively displacing said unitary assembly and said workpiece to shift said localized beam incidence successively over a desired surface region of said workpiece whereby said metal is sequentially electrodeposited on said surface region; and (e) means for maintaining said other end of the elongate solid optical guide member closely spaced from said localized area as said beam and said workpiece are relatively displaced by said means (d).

13. An apparatus for electrodepositing a metal onto a workpiece, comprising:

means for supplying a metal electrodepositing solution in a flow between said workpiece and an electrode constituted by a hollow, elongate electrically conductive member;

means for passing an electric current between said workpiece and said electrode member in the presence of the flowing solution therebetween;

a source of a narrow thermal light beam connected to one open end of said hollow, elongate electrode member for emitting and transmitting therethrough, said beam to project if from the other open end of said hollow electrode member onto a localized area on the workpiece across a small spacing traversed by said flowing solution; and means for relatively displacing said hollow electrode member and said workpiece so as to shift said localized area successively in a scanning manner over a desired surface region on said workpiece whereby said metal is sequentially electrodeposited on said surface region.

14. The apparatus defined in claim 11, claim 12 or 13 wherein said means (c) includes a laser constituting a source of said beam.

15. The apparatus defined in claim 11 wherein said laser is argon gas laser.

16. The apparatus defined in claim 15 wherein said other open end of said hollow member is fitted with a transparent or semitransparent solid member for preventing introduction thereinto of said electrodepositing solution in the region of said workpiece.

17. The apparatus defined in claim 16, further comprising means for filling the hollow space in said member with a pressurized gas to prevent introduction thereinto of the electrodepositing solution in the region of said workpiece.

18. An apparatus for electrodepositing a metal onto a workpiece, comprising:

means for bringing a metal electrodepositing solution into contact with said workpiece and an electrode;

power supply means for passing an electric current between said electrode and said workpiece through said solution;

a laser generator for emitting a laser beam;

a mirror means for reflecting said beam from the generator to cause it to be incident upon a localized area on the workpiece, thereby activating the interface between said area and said solution to allow said metal to be electrodeposited therefrom selectively onto said area, said laser generator being fixed in position relative to said workpiece;

means for translationally displacing said mirror means to translationally shift said localized beam incidence successively in a scanning manner over a desired surface region of said workpiece whereby said metal is sequentially electrodeposited on said surface region.

19. An apparatus for electrodepositing a metal in a continuous layer of a uniform thickness onto a workpiece of an intricate surface contour, comprising:

means for passing an electric current between an electrode and the workpiece in the presence of a metal electrodepositing solution therebetween;

laser generator means for emitting a laser beam;

lens means disposed in an optical path of the laser beam to cause the beam to be incident on a localized area of the workpiece, thereby activating an interface between said area and said solution to allow the metal to be electrodeposited therefrom selectively onto said area;

means for relatively displacing said incident laser beam and said workpiece generally translationally in a scanning manner such as to shift said localized beam incidence continuously over a desired surface region on the workpiece surface whereby said metal is progressively electrodeposited in the continuous layer on said surface region; and means for controlling the position of said lens means in said path so as to maintain said incident beam to be always focused on the instantaneous localized area in said region against a changing thickness of said flowing solution transversed by said incident beam.

20. The method defined in claim 10, further comprising the step of maintaining the thickness of said solution traversed by said laser beam incident upon said localized area to be not greater than 5 cm.

21. The method defined in claim 20 wherein said thickness is limited not to exceed 1 cm.

22. The method defined in claim 20 or claim 21 wherein said laser is an argon gas laser.

23. The method defined in claim 20 wherein said thickness is limited not to exceed 5 mm.

24. The method defined in claim 23 wherein said laser is a carbon-dioxide laser.

25. The method defined in claim 24 wherein said thickness is limited not to exceed 1 mm.

26. A method of electrodepositing a metal on a workpiece, comprising the steps of:

passing an electric current between an electrode and the workpiece in the presence of a metal electrodepositing solution flowing therebetween and in contact therewith;

directing a narrow thermal light beam from a source thereof towards the workpiece through said flowing solution of a varying thickness to cause said beam traversing said flowing solution to be incident upon a localized area of the workpiece, thereby activating an interface between said area and said flowing solution to allow said metal to be electrodeposited therefrom selectively onto said area;

relatively displacing said source and said workpiece in a scanning manner to shift said localized beam incidence successively over a desired surface region on the workpiece surface whereby said metal is sequentially electrodeposited on said surface region; and increasing the accuracy of the successive localized electrodepositions of the metal over said region by disposing a lens means in a path of said beam between said source and said flowing solution and controlling the position of said lens means in said path to maintain said incident beam to be always focused on the instantaneous localized area in said surface region against said varying thickness of said flowing solution in said path of the beam.

27. An apparatus for electrodepositing a metal onto a workpiece, comprising:

means for supplying a metal electrodepositing solution in a flow between the workpiece and an electrode;

means for passing an electric current between the workpiece and the electrode in the presence of said flowing electrodepositing solution therebetween and in contact therewith;

means for directing a laser beam from a source thereof through said flowing solution of a varying thickness towards said workpiece to cause the beam to be incident upon a localized area of the workpiece, thereby activating an interface between said flowing solution and said area to allow the metal to be electrodeposited therefrom selectively onto said area, said directing means including lens means disposed in a path of asaid beam between said source and said workpiece and out of contact with said source and said workpiece and out of contact with said flowing solution;

means for relatively displacing said source and said workpiece generally translationally in a scanning manner such as to shift said localized beam incidence successively over a desired surface region on the workpiece whereby said metal is sequentially electrodeposited on said surface region; and means for controlling the position of said lens means.

* * * * *